United States Patent [19]
Philippe

[11] Patent Number: 5,389,891
[45] Date of Patent: Feb. 14, 1995

[54] SEMICONDUCTOR DEVICE COMPRISING A TWO-STAGE DIFFERENTIAL AMPLIFIER

[75] Inventor: Pascal Philippe, Caen, France

[73] Assignee: U.S. Philips Corporation, New York, N.Y.

[21] Appl. No.: 995,452

[22] Filed: Dec. 21, 1992

[30] Foreign Application Priority Data

Dec. 23, 1991 [FR] France .................. 9116035

[51] Int. Cl.$^6$ .............................................. H03F 3/45
[52] U.S. Cl. .................................... 330/253; 330/310
[58] Field of Search ............... 330/252, 253, 258, 261, 330/310

[56] References Cited

U.S. PATENT DOCUMENTS 5,057,788 10/1991 Ushida et al. .................. 330/310 X
5,068,621 11/1991 Hayward et al. ................... 330/253

FOREIGN PATENT DOCUMENTS 2734945 2/1979 Germany .

OTHER PUBLICATIONS

"Operational Amplifiers" Design and Applications, G. Graeme et al, Chapter 4.

*Primary Examiner*—Steven Mottola
*Attorney, Agent, or Firm*—Bernard Franzblau

[57] ABSTRACT

A semiconductor device comprises a two-stage differential amplifier, the amplifier comprising a first differential transistor pair whose transistors are coupled by their source electrodes and each receive an input signal, and a second differential transistor pair whose transistors are coupled by their source electrodes, each of these transistors receive the output of one of the branches of the first differential pair, and each supply an output. In the amplifier each branch of the second differential pair is arranged in series with a branch of the first differential pair so as to form two sub-circuits each including a transistor of the first pair with its load and a transistor of the second pair with its load in a manner such that the two transistors of each sub-circuit share the same current.

8 Claims, 2 Drawing Sheets

SEMICONDUCTOR DEVICE COMPRISING A TWO-STAGE DIFFERENTIAL AMPLIFIER

FIELD OF THE INVENTION

This invention relates to a semiconductor device comprising a two-stage differential amplifier, the amplifier comprising a first differential transistor pair whose transistors are coupled by their respective source electrodes, each of the transistors receiving an input signal and forming a current branch, and a second differential transistor pair whose transistors are coupled by their respective source electrodes, each of the transistors receiving an output signal of the respective branches of the first differential pair, forming a current branch, and supplying an output.

BACKGROUND OF THE INVENTION

Multi-stage differential amplifiers are known, for example, from the book "Operational amplifiers", Design and Applications, by G. GRAEME et al, published by McGRAW-HILL BOOK COMPANY, New-York, copyright 1971. Chapter 4 of this book deals with multi-stage differential amplifiers. A differential amplifier comprises, for example, two emitter-coupled transistors each having a collector load. The bases each receive an input signal and the outputs are available on the collectors. A multi-stage differential amplifier is simply formed by two or more of these stages in such a way that the output of a branch of a first stage is fed to the input of a branch of a second stage.

The present invention proposes a circuit arrangement for use in the field of wireless telephones, mobile receivers and all other receivers requiting balanced circuits with a low power consumption and low manufacturing costs for use in consmer products.

It is an object of the invention to provide a circuit arrangement having a differential gain as high as that of the prior-art circuit arrangements but having a lower power consumption.

It is another object of the invention to provide a circuit arrangement having a satisfactory signal-to-noise ratio.

It is a further object of the invention to provide a circuit arrangement having a common-mode rejection better than that of the prior art.

SUMMARY OF THE INVENTION

These objects are achieved by means of a device which has the features defined in the opening paragraph and which, in addition, is characterised in that each branch of the second differential pair is arranged in series with a respective branch of the first differential pair so as to form two sub-circuits each comprising a transistor of the first differential pair and a load, and a transistor of the second differential pair and a load, in a manner such that the respective transistors of each sub-circuit share the same current.

The advantages of the resulting differential circuit arrangement include a high gain and high common-mode rejection.

BRIEF DESCRIPTION OF THE DRAWINGS

The invention will now be described in more detail with reference to the accompanying drawings, in which.

DESCRIPTION OF EMBODIMENTS

Figure 1:
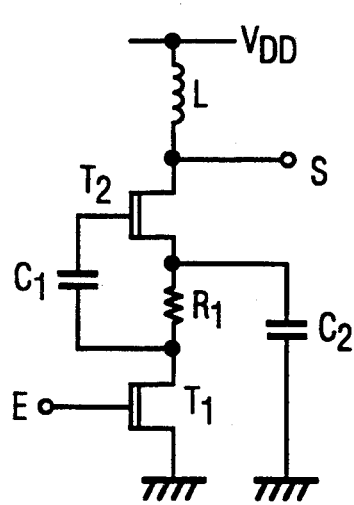
FIG. 1 shows an amplifier.

The amplifier arrangement shown in FIG. 1 comprises two field effect transistors T1 and T2. The transistor T1 is connected in common or grounded source arrangement. The transistor T2 is coupled to the transistor T1 by the resistive load R1 connected between the source of T2 and the drain of T1. The signal to be amplified is applied to a terminal E, i.e. to the gate of T1. The amplified signal appearing on the drain of T1 is applied to the gate of T2 via an isolating capacitor $C_1$. The source electrode of the upper transistor T2 should be grounded for a.c. in order to provide gain. T2 is grounded by means of the capacitance $C_2$ having a low impedance. The drain of T2 forms the output S of the amplifier. The transistor T2 has a load L connected between its drain and a d.c. supply $V_{DD}$.

Figure 2:
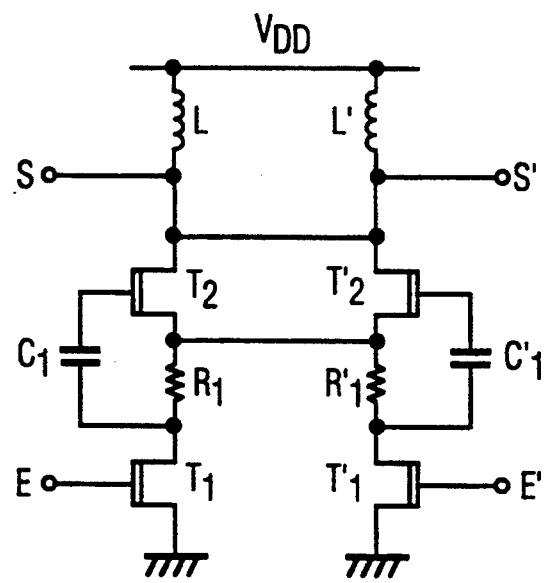
FIG. 2 shows a differential amplifier.

In FIG. 2 the differential amplifier arrangement in accordance with the invention has a symmetrical construction and comprises two identical sub-circuits coupled to one another. Each of the sub-circuits is an amplifier as shown in FIG. 1, which amplifier comprises a first transistor, T1 and T'1 respectively, having a load, R1 and R'1 respectively, and in series with said first transistor a second transistor, T2 and T'2 respectively, having a load, L and L' respectively. Each branch thus formed by four elements arranged in series is connected between ground and the $V_{DD}$ supply. The capacitance $C_2$ connecting the source electrode of T2 or T'2 to ground has been dispensed with. The differential amplifier in accordance with the invention is obtained by coupling two sub-circuits. Coupling is effected by connecting the source electrodes of the upper transistors T2 of each of the sub-circuits to the same point, the source electrodes of the lower transistors T1, T'1 being connected to ground. This circuit arrangement is symmetrical and can be analyzed in the customary manner by separately examining its operation in the differential mode and in the common mode.

Figure 3A:
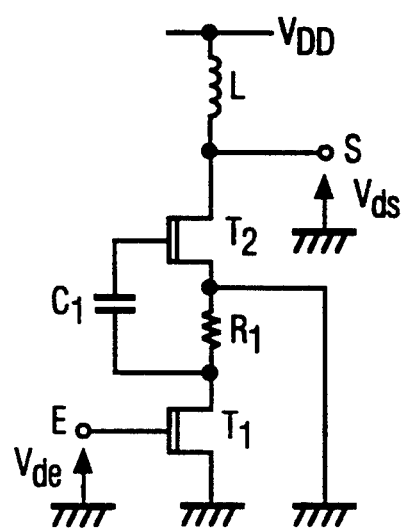
FIGS. 3a and 3b show equivalent circuits of the differential amplifier in the differential mode and in the common mode.

FIG. 3a shows the equivalent circuit in the differential mode. The coupling point, i.e. the source electrode of the transistor T2 of each sub-circuit, becomes a virtual ground. The two sub-circuits are isolated from one another, so that the analysis of the circuit arrangement can be restricted to the analysis of one of the sub-circuits. The differential voltage gain Gd corresponds to that of a cascade of two grounded-source amplifiers but is higher. If the parasitic capacitances of the transistors are ignored, this yields:

$$G_d = [-g_{m1}R_1/(1+g_{d1}R_1)] \times [-g_{m2}R_2/(1+g_{d2}R_2)]$$

where $g_{m1}$ and $g_{d1}$ are the transconductance and the output conductance of the transistor T1, $g_{m2}$ and $g_{d2}$ being the same parameters for the transistor T2.

Figure 3B:
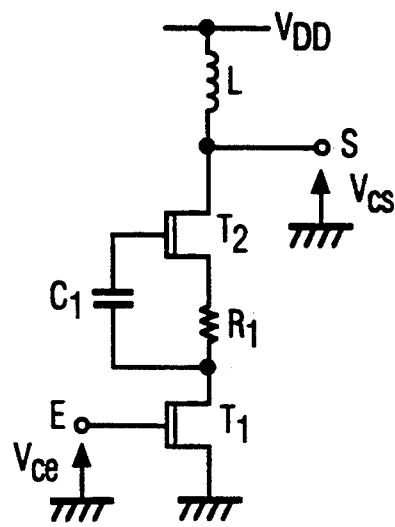

The common-mode equivalent circuit is shown in FIG. 3b. There is no current in the branch coupling the source electrodes of the transistors T2, so that it may be removed without the behaviour of the arrangement being affected thereby. Consequently, the source electrodes of the transistors T2 are floating in the common mode. In the same way as in the differential mode the analysis may be restricted to one sub-circuit. The behaviour in the common mode differs substantially from the behaviour in the differential mode, in particular because the upper transistor T2 has a very low gain owing to the feedback provided by the resistor R1. When the effect of the parasitic capacitances of the transistors is ignored the common-mode voltage gain Gc is given by:

$$G_c = [-g_{m1}/(g_{d1}+g_{d2}/K))] \times [g_{d2} \cdot R_2/K]$$

where $K = 1 + (g_{m2} + g_{d2})R1 + g_{d2}R2$.

Since the parameter K is substantially greater than 1 the above expression may be reduced to:

$$G_c = [-g_{m1} \cdot g_{d2} R_2 / K \cdot g_{d1}]$$

If the transistors T1 and T2 are identical and R1=R2 (as is the case in the embodiment to be described hereinafter) the differential-mode gain and the common-mode gain will be given by:

$$G_d = [-g_m R/(1+g_d \cdot R)]^2$$

$$G_c = [-g_m R/(1+g_m \cdot R + 2g_d \cdot R)]$$

The ratio R between the differential-mode gain and the common-mode gain is given by:

$$R = G_d/G_c = -g_m R[1+(g_m+2g_d) \cdot R]/[1+g_d \cdot R]^2$$

The differential amplifier shown in FIG. 2 inter alia has the following advantages:
 a high differential gain equivalent to that of two grounded-source stages as known from the prior art,
 a high common-mode rejection obtained without the need to use current sources having a high output impedance as is known from the prior art,
 a smaller power consumption in relation to the resulting gain because the transistors T1 and T2 of each sub-circuit share the same current, and
 a very low signal-to-noise ratio, even in the common mode, because the feedback causing the low common-mode gain is applied to the upper transistor T2 (or T'2), i.e. to the second amplifier stage, as it were. Therefore, T1 will operate with a low noise and will contribute to a satisfactory signal-to-noise ratio in the common mode as a result of the masking effect owing to its gain.

In a modification of the circuit arrangement shown in FIG. 2 a current source may be arranged between the coupled source electrodes of the lower transistors T1 and T'1. The supply voltage $V_{DD}$ should then be higher.

Figure 4:
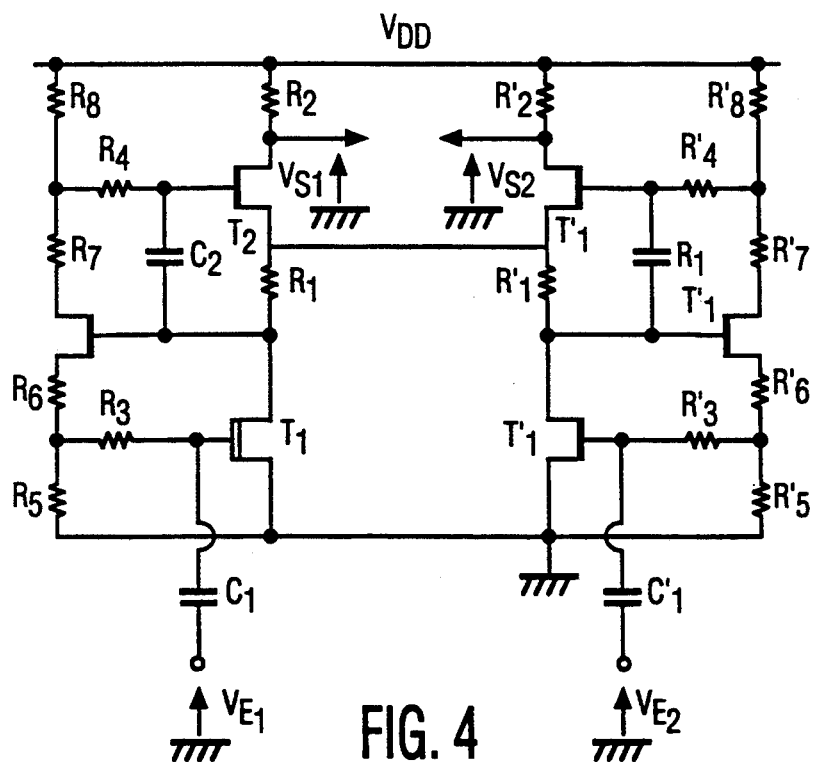
FIG. 4 shows an exemplary embodiment.

FIG. 4 shows an embodiment of a differential amplifier based on the amplifier described with reference to FIG. 2. This arrangement is realised by means of gallium arsenide (GaAs) field-effect transistors of the enhancement type, i.e. normally cut off in the absence of a gate-source voltage.

The transistors T1, T'1, T2, T'2 are identical. They are biased by means of a sub-circuit comprising the transistors T3 and T'3.

Figure 5A:
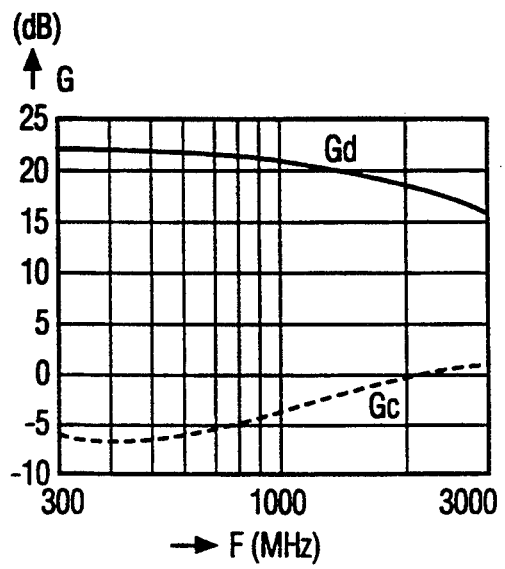
FIGS. 5a and 5b are curves representing the gain as a function of the frequency for two examples of the circuit arrangement shown in FIG. 4.
Figure 5B:
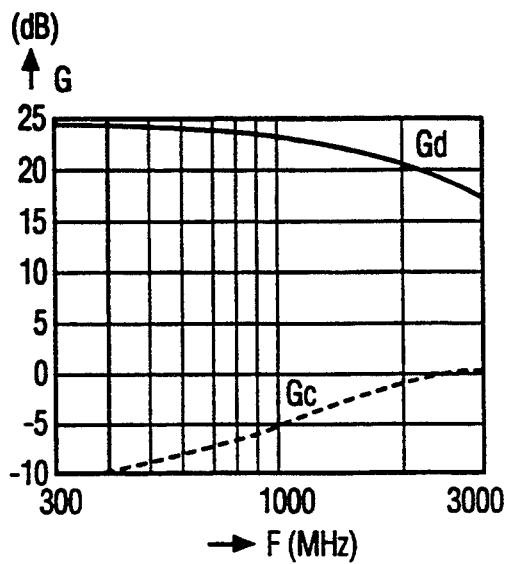

FIGS. 5a and 5b represent the gain factors $G_c$ and $G_d$ as a function of the frequency F obtained with circuits as shown in FIG. 4 but realised by means of circuit elements having different values.

The gain factors have been measured by means of the ratios of the input signals $V_{E1}$ or $V_{E2}$ to the output signals $V_{S1}$ or $V_{S2}$ (see FIG. 4).

I claim:
1. A two-stage differential amplifier comprising: a first differential transistor pair including first and second transistors having their respective source electrodes coupled together in common, each of the transistors receiving an input signal and forming a respective current branch, means connecting said source electrodes directly to ground, and a second differential transistor pair including third and fourth transistors having their respective source electrodes coupled together in common, each of the third and fourth transistors receiving an output signal from the respective branches of the first differential transistor pair, forming a current branch, and supplying an output, wherein each branch of the second differential transistor pair is connected in series with a respective branch of the first differential transistor pair so as to form two sub-circuits each comprising a transistor of the first differential transistor pair and a load, and a transistor of the second differential transistor pair and a load, in a manner such that the respective transistors of each sub-circuit share a same current.

2. A differential amplifier as claimed in claim 1, wherein said transistors are field-effect transistors.

3. A differential amplifier as claimed in claim 2, wherein said field-effect transistors are gallium-arsenide transistors of the enhancement type.

4. A differential amplifier as claimed in claim 1, wherein said transistors include gate bias means comprising; for each sub-circuit, a voltage divider including at least first and second resistors and a field effect transistor connected in series circuit between supply voltage terminal for the amplifier and ground, and means coupling a control electrode of the field effect transistor to an output electrode of a respective transistor of the first differential transistor pair.

5. A differential amplifier as claimed in claim 4 further comprising:
 a first capacitor connected between an output electrode of the first transistor and a control electrode of the third transistor, and
 a second capacitor connected between an output electrode of the second transistor and a control electrode of the fourth transistor.

6. A differential amplifier as claimed in claim 1 further comprising:
 a first capacitor connected between an output electrode of the first transistor and a control electrode of the third transistor, and
 a second capacitor connected between an output electrode of the second transistor and a control electrode of the fourth transistor.

7. A differential amplifier as claimed in claim 1 wherein said loads each comprise a series-connected resistor and the load resistors in each sub-circuit have equal values of resistance.

8. A two-stage differential amplifier comprising;
 first and second transistors forming a first differential transistor pair,
 means connecting first main electrodes of the first and second transistors in common to ground,
 first and second load devices,
 third and fourth transistors forming a second differential transistor pair having first main electrodes connected together in common, third and fourth load devices, first means connecting the third load device, the third transistor, the first load device and the first transistor in a first series circuit between a supply voltage terminal and ground, second means connecting the fourth load device, the fourth transistor, the second load device and the second transistor in a second series circuit between the supply voltage terminal and ground, means for coupling respective control electrodes of the first and second transistors to first and second signal input terminals of the differential amplifier;

means coupling a second main electrode of the first transistor to a control electrode of the third transistor via a first capacitor and coupling a second main electrode of the second transistor to a control electrode of the fourth transistor via a second capacitor, and means coupling second main electrodes of the third and fourth transistors to first and second output terminals, respectively, of the differential amplifier.

* * * * *